(12) United States Patent
Armbruster et al.

(10) Patent No.: US 7,466,973 B2
(45) Date of Patent: Dec. 16, 2008

(54) SINGLE CONVERSION TUNER

(75) Inventors: Veit Armbruster, St. Georgen (DE); Alfred Selz, Deisslingen (DE)

(73) Assignee: Thomson Licensing, Boulogne-Billancourt (FR)

( * ) Notice: Subject to any disclaimer, the term of this patent is extended or adjusted under 35 U.S.C. 154(b) by 631 days.

(21) Appl. No.: 11/120,302

(22) Filed: May 2, 2005

(65) Prior Publication Data
US 2006/0246867 A1 Nov. 2, 2006

(30) Foreign Application Priority Data
May 5, 2004 (EP) .................. 04010664

(51) Int. Cl.
*H04B 1/10* (2006.01)
(52) U.S. Cl. ............... 455/302; 455/150.1; 455/307
(58) Field of Classification Search .............. 455/3.01, 455/3.02, 63.1, 67.13, 150.1, 179.1, 188.1, 455/196.1, 295, 296, 302, 307
See application file for complete search history.

(56) References Cited

U.S. PATENT DOCUMENTS 5,715,012 A 2/1998 Patel et al.
5,930,696 A 7/1999 Tzuang et al.
6,150,891 A 11/2000 Welland et al.
7,236,760 B2 * 6/2007 Cowley et al. ............. 455/296

OTHER PUBLICATIONS

Wegerif S et al. "An integrated CMOS Image-Rejection Mixer System For Low-Jitter Secondary Frequency REferences" IEEE May 3-6, 1993 New York pp. 1010-1013 XP010115272.

* cited by examiner

*Primary Examiner*—Quochien B Vuong
(74) *Attorney, Agent, or Firm*—Joseph J. Laks; Robert D. Shedd; Brian J. Cromarty

(57) ABSTRACT

A single conversion tuner suitable for receiving RF signals having different requirements as to selectivity, linearity and image rejection is presented. Tuners of this kind are particularly useful for digital terrestrial as well as cable reception, where different modulation schemes require very high image rejection ratios on one hand and high linearity or pass band flatness on the other hand. The inventive tuner features a double-tuned tuneable filter in combination with an image reject mixer. The double-tuned filter provides excellent pass band flatness, while the image reject mixer provides a high intrinsic image rejection. The image rejection ratio of the combination of image reject mixer and tuneable filter is very high and fulfils the requirements of commonly used modulation schemes such as 8VSB, while the pass band flatness is compliant with the requirements for modulation schemes such as QAM.

6 Claims, 5 Drawing Sheets

SINGLE CONVERSION TUNER

FIELD OF THE INVENTION

The invention relates to a tuner for receiving modulated RF signals. In particular, the invention relates to a television receiver including a tuner for receiving modulated RF signals.

BACKGROUND OF THE INVENTION

Television signals are transmitted at radio frequencies (RF) using terrestrial, cable, or satellite transmission schemes. Terrestrial and cable TV signals are typically transmitted at frequencies of approximately 57 to 860 MHz, with 6 MHz channel spacings. Satellite TV signals are typically transmitted at frequencies of approximately 980 to 2180 MHz.

Modern television receivers may receive the transmissions directly from antenna or from cable networks. More recently the transmissions are modulated so as to transport digital signals representing audio and video signals of a programme. When digital signals are transmitted, different modulation schemes are used for transmissions to be received directly from antenna, so called off-air signals or terrestrial signals, and transmissions received via a cable network, so-called cable reception. Off-air signals are, for example, modulated in a vestigial side-band modulating scheme, often referred to by its acronym VSB. The Advanced Television Standard Committee ATSC stipulated, for the United States, the use of a particular vestigial side-band modulation scheme: 8VSB. 8VSB is an 8-level vestigial side-band modulation. For cable reception of digital television signals a different modulation scheme is used: QAM. QAM is an acronym for Quadrature Amplitude Modulation. QAM is a combination of amplitude modulation and phase shift keying. Television apparatus must be capable to operate from both signal sources, off-air and cable network. Different modulating schemes, such as 8VSB and QAM, have different requirements as to input sensitivity, image rejection, linearity and pass band flatness of a tuner. 8VSB, e.g., requires a high input sensitivity and large values for the image rejection. On the other hand, QAM used for cable network reception requires good linearity and high flatness of the bandpass filter in first place.

In general, image rejection and linearity are two key performance parameters for RF down-conversion. Image rejection and linearity requirements depend on the specific application and the corresponding display requirements, as discussed above. Because of its importance, image rejection is explained further as follows.

FIG. 1 illustrates an example frequency spectrum 100 that illustrates down-conversion and image rejection as performed by a tuner. More specifically, the spectrum 100 illustrates an exemplary RF input having an RF carrier 110 at 800 MHZ, an RF carrier 114 at 888 MHZ and a local oscillator 112 at 844 MHZ, respectively. For purposes of illustration, the local oscillator input is set to 844 MHZ so that the RF input 102 is frequency translated to 44 MHz by the tuner. Assuming no image rejection, the translated signal 114' falls into the translated IF signal 110' as shown. Image rejection is calculated as the relative amplitude of the desired image compared to the undesired image. For example, if the channel 110' is the desired channel, then the image rejection of the tuner is the ratio of the signal 110' amplitude compared to the signal 114' amplitude. If the tuner had perfect image rejection, then the amplitude of the signal 114' would be zero.

Regardless of the transmission scheme, a tuner is utilized to down-convert the received RF signal to an intermediate frequency (IF) signal or a base band signal, which is suitable for processing for display of transmitted content on a TV or computer screen. The tuner should provide sufficient image rejection during down-conversion as is necessary for the specific application. To process a terrestrial television signal, it is preferable that the tuner has a high level of image rejection, whereas for cable reception a high pass band flatness of the filters may be required. The requirements are, however, depending on the modulation scheme used.

State of the Art single conversion tuners provide sufficient pass band flatness for cable reception. An exemplary single conversion tuner 200 according to the prior art is shown in FIG. 2. In the figure, the signal received from a cable network or an antenna covers a wide range of frequencies. The wide range of frequencies is split into three frequency bands B1, B2, B3. This may be necessary since the tuning range of the tuning circuit of one single tuner may not be sufficient to tune the whole range of input RF frequencies. The wide input range may be split into only 2 bands or into a larger number of bands, depending on the application. However, if the range of frequencies in which RF signals are to be received is narrow enough the band select filter 2 may be omitted. For band splitting the RF signal is typically fed to band select filters 2, which are used to split the rather large range of possible RF frequencies coming from the antenna into a number of paths B1, B2, B3 each covering a smaller range of frequencies. From the band select filters 2 the signal is fed to variable gain amplifiers 3. The variable gain amplifiers 3 are used to provide a suitable signal level to the downstream connected processing stages, in order to prevent overdriving the downstream connected processing stages. Single conversion tuners typically have tuneable filters 4 upstream of mixers 6. The tuneable filter 4 is used to select a desired frequency for down-mix in the mixer 6 and to reject the image signal of the tuned channel. The tuneable filters 4 must have a rather large pass band bandwidth while providing good pass band flatness. Therefore, the filters are often implemented as double-tuned tuneable filters. Single-tuned tuneable filters typically do not exhibit sufficient flatness in the pass band. This excludes the use of single-tuned tuneable filters for certain applications. Controllable mixers 6 down-convert the signal coming from the tuneable filters to a fixed intermediate frequency IF, which is lower than the RF frequency. Down-mixing of the received RF frequencies is necessary since the processing circuitry which is extracting the transmitted content from the modulated RF signal is not capable of directly operating in the high frequency ranges which are transmitted. Variable frequency oscillators LO1, LO2, LO3 are used to tune the various input frequencies to the desired intermediate frequency IF. In a typical receiver known from the state of the art a filter 7 with a narrow bandwidth and having a fixed centre frequency is connected to the output of the mixer 6. This filter is provided to isolate the desired signal from the group of output signals present at the output of the mixer. In FIG. 2 a surface acoustic wave filter, also referred to by its acronym SAW, provides this channel separation. The SAW filter has a fixed centre frequency which is corresponding to the intermediate frequency IF. An amplifier 8 may be provided to buffer the filtered intermediate frequency IF. The tuner shown in FIG. 2 may be adapted to receive signals from an antenna, as shown in the figure, or to receive signals from a cable network. Depending on the type of signals the tuner is designed for, the double-tuned filter may have different properties as to bandwidth and slope.

Double-tuned filters are requiring a rather high number of selected and matched components and efforts have been made, therefore, to reduce the amount of circuit outlay necessary.

To achieve a high level of image rejection, state-of-the-art tuners utilise a dual-conversion architecture having two mixers and surface acoustic wave filters 7. An exemplary block diagram of a double conversion tuner 300 according to the state of the art is shown in FIG. 3. The tuner 300 performs two frequency translations (one up-conversion, one down-conversion) to meet the high image rejection requirement. Overall, the tuner 300 down-converts a selected channel from a radio frequency signal RF, and outputs the selected channel as an intermediate frequency signal IF2. In the figure, the RF signal having multiple channels at multiple carrier frequencies is received by an antenna 1. The antenna may also be a cable network connection. The RF signal is typically fed to a band select filter 2, which is used to split a rather large range of possible RF frequencies into a number of paths each accommodating a smaller range of frequencies, as was discussed above. In FIG. 2 only one exemplary path of a tuner is shown. The signal is then fed to a variable amplifier 3. The variable amplifier 3 ensures that the following stages receive a signal at an appropriate level. A first mixer 4 up-converts the received RF signal to a first intermediate frequency IF1 that is fixed above the RF signal band, using a first, variable-frequency local oscillator signal LO. The local oscillator signal is controllable so as to obtain an up-converted signal at a fixed first intermediate frequency IF1, above the range of the input frequencies. A surface acoustic wave filter 7, centred at the first intermediate frequency IF1 and having a narrow pass band at the intermediate frequency IF1 selects a desired channel that falls within its narrow pass band. The SAW filter substantially rejects all of the remaining channels and provides the necessary image rejection to prevent signal interference. A second mixer 9, which is driven by a fixed frequency local oscillator signal LO2, down-converts the signal at the first intermediate frequency IF1 to a lower second intermediate frequency IF2. The frequency of the signal LO2 is appropriately selected to provide an IF at the desired intermediate frequency IF2. A second SAW filter 11 further removes any unwanted signals from the intermediate-frequency signal, resulting in the signal IF2. The signal IF2 is amplified by the amplifier 8, to produce the output. Channel selection is realised by adjusting the first and second local oscillator signals LO, LO2 so that the desired up-converted channel falls in the narrow pass band of the SAW filters 7, 11. The remaining channels, in particular the adjacent channels, are rejected by the SAW filters.

The dual conversion architecture of the conventional tuner 300 has several disadvantages. For instance, there are two of each component including two mixers, two high frequency local oscillators, and two SAW filters. In this tuner concept, fair image rejection is achieved at the expense of higher noise and the associated lower sensitivity due to the double conversion.

The high outlay in circuitry and the rather high number of components necessary for building double-conversion tuners and double-tuned filters in single- or direct-conversion tuners has led to efforts to reduce the complexity of the tuners.

One method is using an image reject mixer in a single conversion tuner. The image reject mixer is key to performing the down-conversion operation in a single frequency conversion, instead of the conventional dual-conversion operation. In other words, the image reject feature supplants the need for a dual conversion architecture.

FIG. 4 illustrates an image reject mixer 400. The image reject mixer 400 includes an in-phase divider 402, component mixers 404a, 404b, and a quadrature divider 406. The in-phase divider 402 receives an RF input signal RF, and divides the signal RF into component signals 403a and 403b, where the signals 403a and 403b are substantially equal phase and equal amplitude. Signals 403a and 403b are also referred to as I-component and Q-component, respectively. The quadrature divider 406 receives a local oscillator signal LO and divides the signal LO into component LO signals 405a and 405b, where the signal 405b is phase shifted by 90 degrees relative to the signal 405a. The mixer 404a mixes the I-component signal 403a with the LO signal 405a, resulting in the in-phase IF component I. The mixer 404b mixes the Q-component signal 403b with the LO signal 405b, resulting in the quadrature IF component Q. The in-phase IF component I and the quadrature IF component Q are combined by a polyphase filter (not shown). The image rejection occurs when the in-phase and quadrature components I, Q are combined because the phase relationship between I and Q components causes signal cancellation at the image frequency.

Theoretically, infinite image rejection is achievable if the I and Q channels of the mixer 400 are perfectly balanced at the frequency of interest. However, if the phase relationship between the I and Q channels varies from 90 degrees at some frequency, then the actual image rejection deteriorates at this frequency. Additionally, if the amplitude varies between the I and Q channels, then the image rejection also deteriorates. The amplitude and phase relationship between the I and Q channels is often collectively referred to as I/Q balance. Perfect I/Q balance is achieved when the amplitude response of the I and Q channels is equal over frequency, and the phase difference between the I and Q channels is 90 degrees over frequency.

In FIG. 5 a prior art tuner 500 is shown that uses an image reject mixer 400 as presented above. As was discussed above, image reject mixers provide inherent image rejection due to their principles of operation. In FIG. 5 an RF signal having multiple channels is received by an antenna 1. The signal is fed via a tuneable pre-select filter 4 and an amplifier 3 to the image-reject mixer 400. Amplifier 3 is a variable gain amplifier that ensures a proper signal level for the following processing stages. The image reject mixer 400 directly down-converts the input signal RF to an intermediate frequency signal IF1, using a local oscillator signal LO. The local oscillator is variable, responsive to a tuning signal (not shown) in order for the downmixed intermediate frequency signal IF1 to fall in the narrow pass band of a filter 7. Image reject mixers provide a relatively high level of image frequency rejection by way of operation. Since image rejection is one of the main objectives of tuner designers and developers the selectivity of the tuned filter circuit upstream of the mixer may be small. Downstream of the image reject mixer the downmixed intermediate frequency signal IF1 is fed to the filter 7, which selects the channel of interest from the IF signals. The filtered signal is further connected to an amplifier 8. Channel selection is performed by changing the frequency of the signal LO1, thereby causing the desired channel to shift into the pass band of the filter 7. The image rejection of this circuit is determined by the image rejection properties of the image rejection mixer 400 and the selectivity of the filter 4.

FIG. 6 shows another prior art tuner 600 using an image-reject mixer 400. An RF signal is received by an antenna 1 and fed via a band select filter 2 and a variable gain amplifier 3 to a variable low-pass filter 14. From the variable low-pass filter 14 the signal is fed to the image-reject mixer 400. The intermediate frequency IF1 at the output of the image-reject mixer 400 is fed via SAW filter 7 for channel separation to an amplifier 8. In the same way as for the circuit of FIG. 3 this tuner provides a fair amount of image rejection at a reasonable circuit complexity. The low pass filter prevents overdriving of the mixer by higher-frequency harmonics of the input signal. However, the low-pass filter does not reject sub-harmonic frequencies. This may cause an overdrive at the input of the image-reject mixer and/or lower frequencies being mixed into the desired output signal.

In view of what was explained above it may be stated that the known single- and double-conversion tuner concepts are not ideally adapted for performing both, off-air and cable reception. In order to compensate for the drawbacks of the different tuner concepts and the associated detrimental effects on the reception quality, state-of-the-art television receivers for off-air and cable reception use two tuners that are each optimised for off-air reception or cable network reception, respectively.

SUMMARY OF THE INVENTION

It is, therefore, desirable to provide a single tuner for receiving modulated RF signals that exhibits good input sensitivity and image rejection properties for off-air reception as well as high pass band flatness and linearity for cable reception.

The inventive circuit as claimed in claim 1 provides such a desired tuner.

The inventive tuner for receiving modulated signals having different requirements regarding image rejection, pass band flatness and input sensitivity down-converts a selected channel directly from an RF frequency to an IF frequency without performing an intermediate up-conversion frequency translation as in conventional tuners.

The inventive single conversion tuner includes a pre-select filter, an amplifier, a tuneable bandpass filter and an image reject mixer. The pre-select filter receives an RF signal having multiple TV channels. The tuneable bandpass filter provides a first selection of a desired channel and exhibits a good linearity and pass band flatness. The image reject mixer down-converts a selected channel to an IF frequency that is within the pass band of an IF filter connected downstream. Channel selection is performed by tuning the frequency of a local oscillator signal that drives the image reject mixer, and thereby tuning the channel that is translated into the pass band of the IF filter. In parallel, the frequency of the tuneable bandpass filter upstream of the image reject mixer is tuned.

BRIEF DESCRIPTION OF THE DRAWINGS

Exemplary embodiments of the invention are illustrated in the drawings and are explained in more detail in the following description.

In the drawings:

In the drawings, same or similar elements are designated by the same reference symbols.

FIGS. 1 to 6 have already been discussed above with respect to the prior art and are, therefore, not addressed again.

DETAILED DESCRIPTION OF PREFERRED EMBODIMENTS

Figure 7:
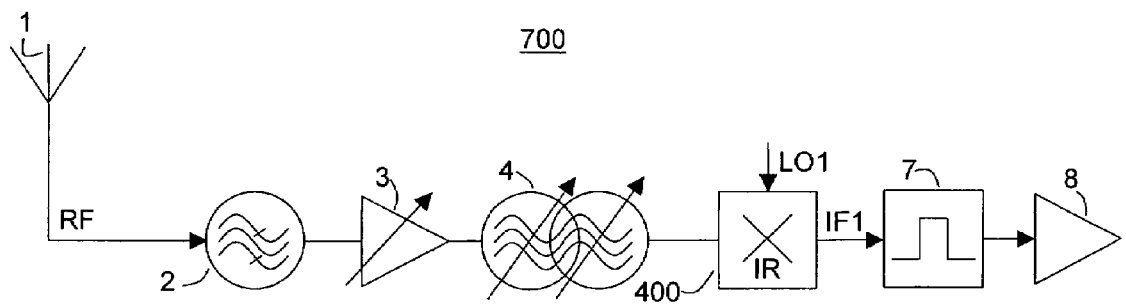
FIG. 7 presents a tuner using an image reject mixer according to an aspect of the invention.

In FIG. 7 a tuner 700 using an image reject mixer according to an aspect of the invention is presented. In the tuner 700 a radio frequency signal RF is received via an antenna 1. The signal RF received by antenna 1 is coupled to a band select filter 2. From the band select filter 2 the signal is passed-on via a variable gain amplifier 3 to a double-tuned tuneable filter 4. From the double-tuned tuneable filter 4, the signal is coupled to an image reject mixer 400. The image reject mixer 400 is driven by a variable local oscillator signal LO1 and down converts the RF signal to an intermediate frequency signal IF1. The intermediate frequency signal IF1 is further fed to an SAW filter 7 for channel separation. An amplifier 8 receives the filtered signal IF1 and buffers it for further processing.

The advantages which result from the inventive tuner circuit 700 will now be described with reference to FIGS. 8 to 10.

Figure 1:
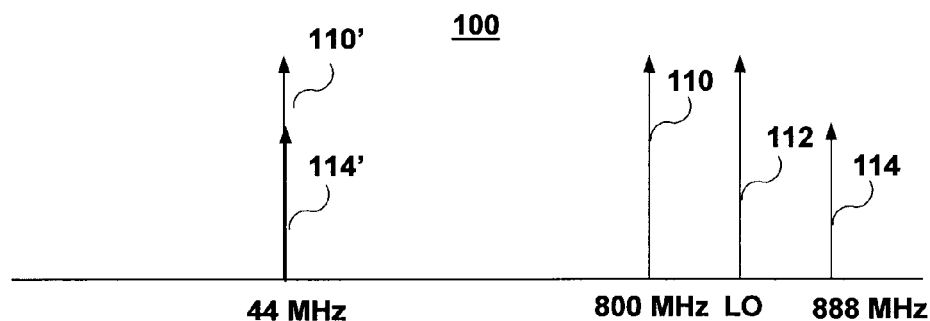
FIG. 1 shows a schematic representation of the frequency distribution for down-mixing.
Figure 8:
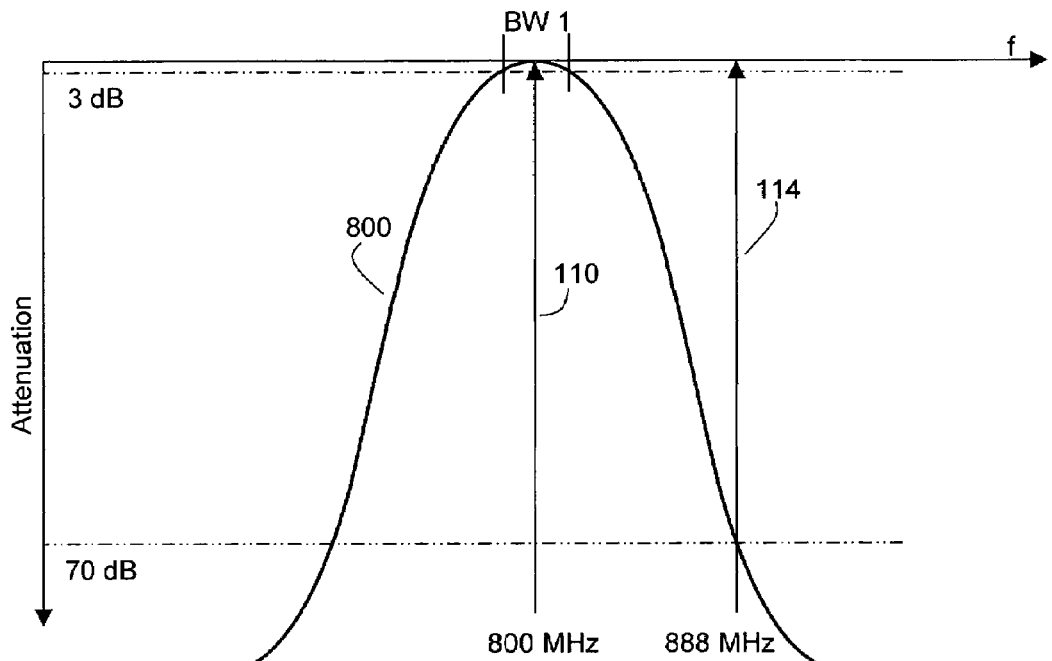
FIG. 8 is a diagrammatic representation of attenuation versus frequency of a double-tuned, narrow band filter for best image rejection.

In FIG. 8 the attenuation versus frequency for a double tuned, narrow band filter 800 is shown in a schematic representation. The filter is tuned to a desired frequency 110, which is chosen to be 800 MHz, in accordance with FIG. 1. The desired pass band bandwidth BW1 is indicated by vertical lines at the low and high 3 dB corner frequencies, respectively. The double tuned filter 800 has an attenuation of 70 dB at the frequency of the signal 114 at 888 MHz, which would be the image signal when down converting with a local oscillator at 844 MHz (not shown in FIG. 8), as presented in FIG. 1. The values for image rejection are typical values and are used for illustration purposes only. Other values may be found, depending on the application. The image rejection value may be sufficient for off-air reception. However, the pass band bandwidth BW1 may be too small for certain modulating schemes, e.g. schemes used in digital cable reception.

Figure 9:
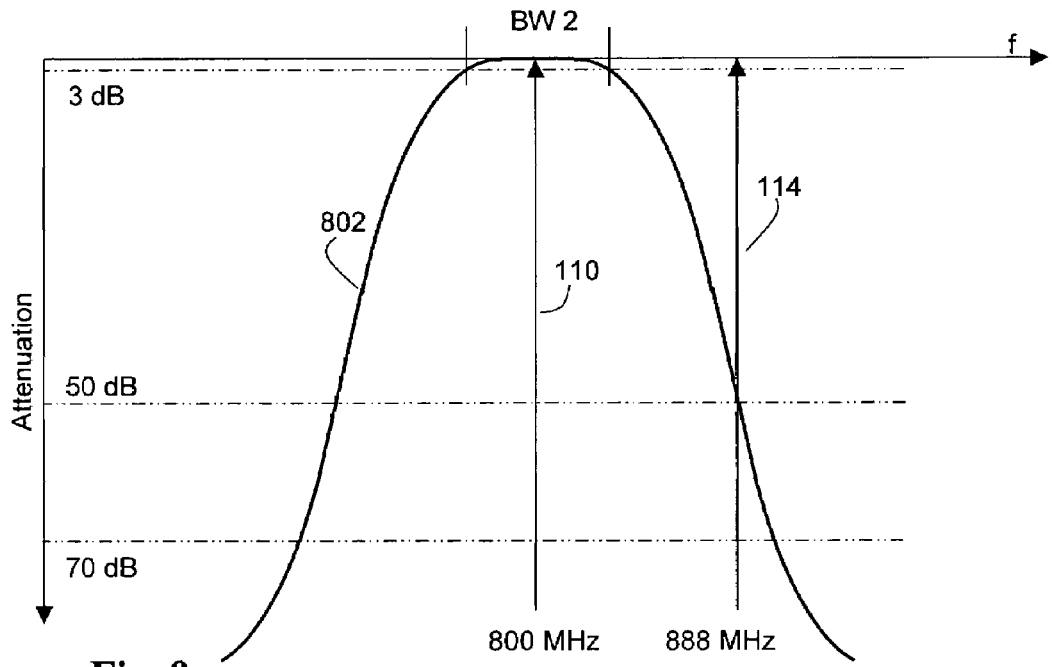
FIG. 9 is a diagrammatic representation of attenuation versus frequency of a double-tuned, wide band filter for best bandpass flatness.

FIG. 9 shows the attenuation versus frequency for a double tuned filter with wide bandwidth 802. The signals and local oscillator frequency (not shown) are assumed identical to the signals shown in FIG. 8. This filter provides a larger pass band bandwidth BW2, as shown, compared to the filter in FIG. 8, and thus high pass band flatness. However, the image rejection value of the signal 114 is smaller when compared to the value of FIG. 8.

Figure 10:
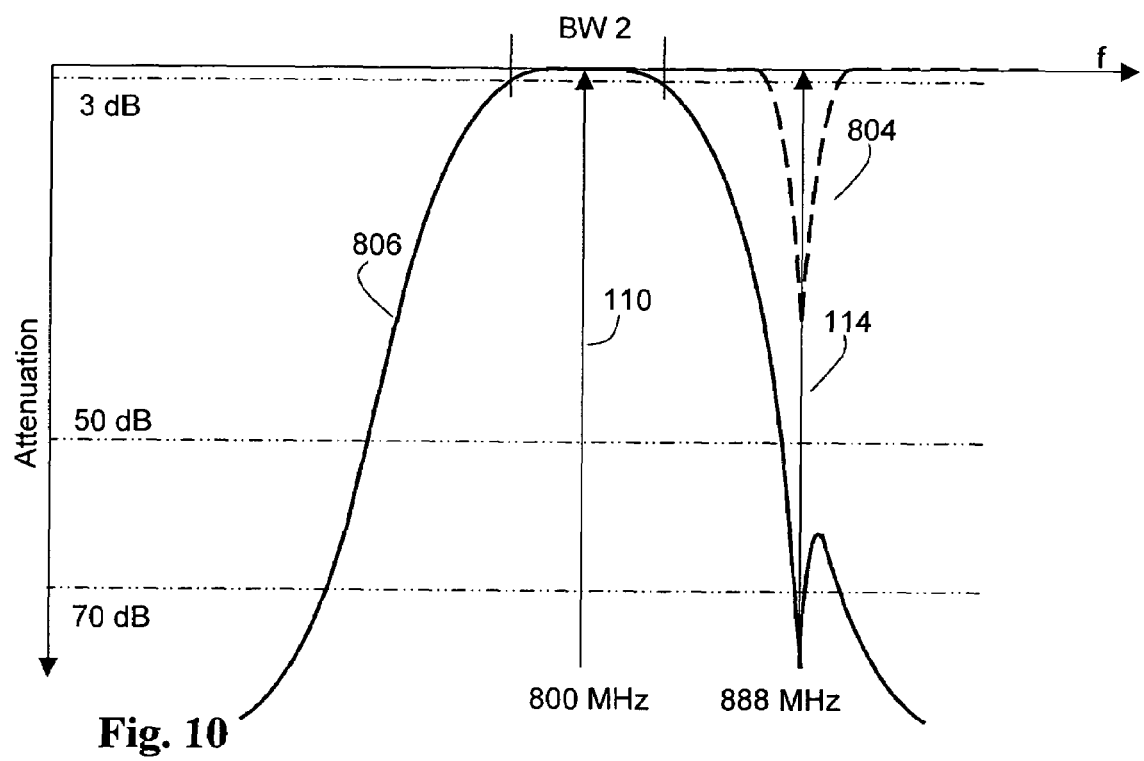
FIG. 10 is a diagrammatic representation of attenuation versus frequency of a combination of a double tuned, wide band filter and an image reject mixer according to the invention.

In FIG. 10 the combined attenuation versus frequency of a double tuned filter 802 and an image reject mixer 804 are shown in a schematic representation as curve 806. The curve 804 of the image reject mixer is shown in a dashed line. The effect of the image reject mixer may be regarded as a pole that is introduced at the image frequency of signal 114, while leaving the desired signal 110 unchanged. An ideal image reject mixer would provide infinite image rejection. However, ideal image reject mixers do not exist, and typical values for image rejection are around 30 dB. When the curves of the double tuned filter and the image reject mixer are combined, the image rejection values add up. Curve 806 shows how the superimposed curves of double tuned filter 802 and image reject mixer 804 may look like in a typical application according to the invention. The image reject mixer acts like a steep notch filter at the image frequency and adds some 30 dB of image rejection to the image rejection of the double tuned filter. The overall image rejection exceeds the desired 70 dB and the pass band bandwidth BW2 has substantially the same value as the double tuned filter when taken alone.

As stated above, the values are chosen for illustration purposes only. Values may vary depending on the actual choice of components and design. However, the effect of the inventive combination of image reject mixer and double tuned filter as to pass band bandwidth and image rejection is to be found in other embodiments implementing the invention.

The inventive tuner is suitable for receiving modulated RF signals that have different requirements so as to image rejection, selectivity, and band pass flatness. The single conversion concept of the inventive tuner further provides a low noise figure, which improves the sensitivity of the tuner. The inventive tuner may be used in television or radio receivers as well as in any device for receiving modulated RF signals.

Figure 2:
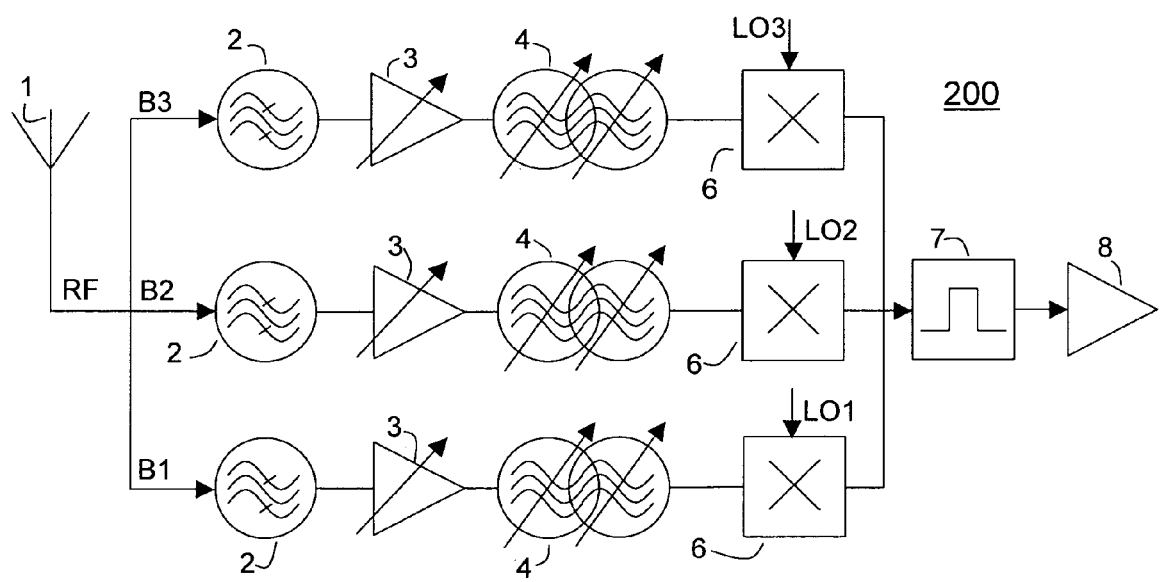
FIG. 2 shows a diagrammatic representation of a single conversion tuner according to the prior art.
Figure 3:
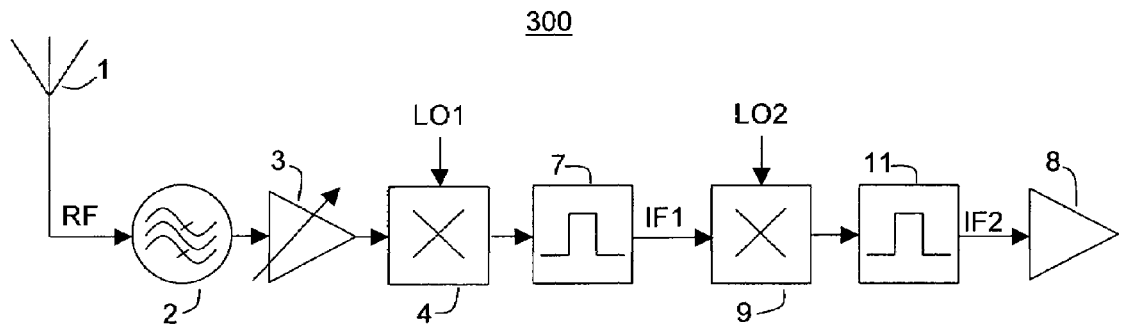
FIG. 3 illustrates a diagrammatic representation of a double conversion tuner according to the prior art.
Figure 4:
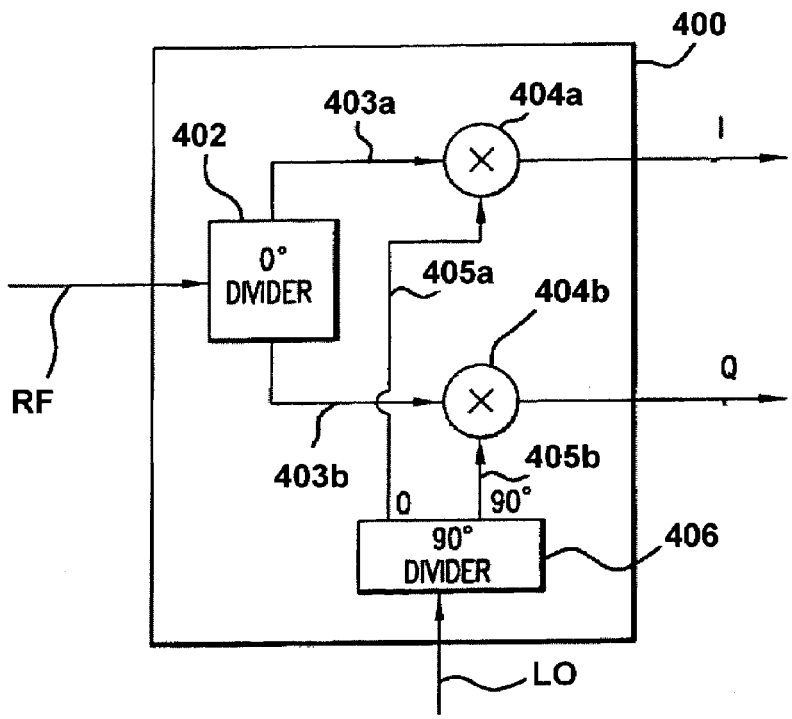
FIG. 4 presents a block diagram of an image reject mixer.
Figure 5:
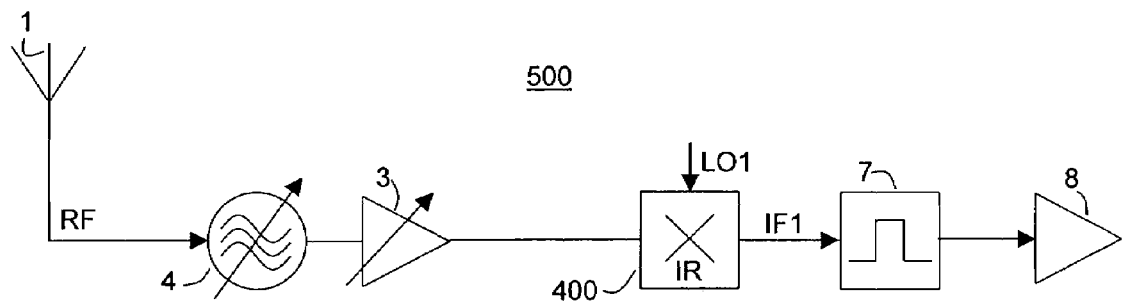
FIG. 5 depicts a first diagrammatic representation of a single conversion tuner according to the prior art using an image rejection mixer.
Figure 6:
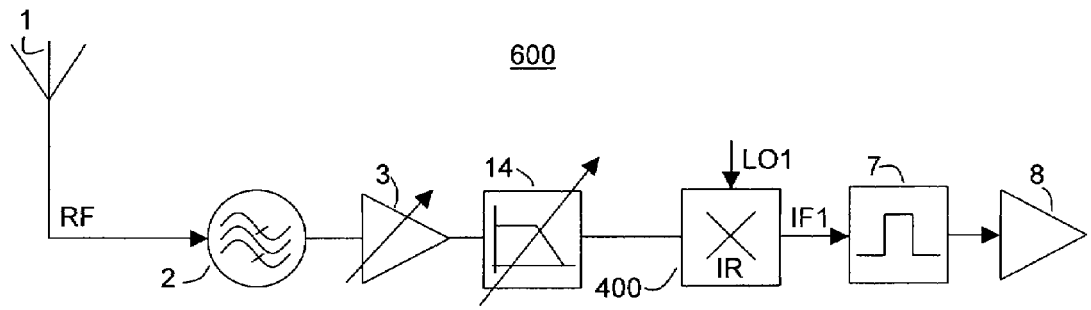
FIG. 6 shows a second diagrammatic representation of a single conversion tuner according to the prior art using an image rejection mixer and a low pass filter.

The invention is not limited to the IQ image reject mixer 400 that is shown in FIG. 2. Other image reject mixers can be utilized, as will be understood by those skilled in the arts, including but not limited to passive mixers.

Throughout this specification the antenna symbol and reference numeral 1 have been used interchangeably for any RF signal input source. No limitation whatsoever as to the RF signal input source for the inventive tuner circuit is intended.

What is claimed is:

1. A single conversion tuner adapted to selectively receive modulated signals of a first and a second type at an input, the signals of the first type being modulated according to a first modulation scheme and the signals of the second type being modulated according to a second modulation scheme, wherein the first modulation scheme requires a flat amplitude response over a predetermined bandwidth, and wherein the second modulation scheme requires a predetermined ratio of image rejection, including a tuneable bandpass filter that is adapted to provide a flat amplitude response over the predetermined bandwidth for receiving signals according to the first modulation scheme and which provides a first ratio of image rejection, wherein the ratio of image rejection provided by the tuneable bandpass filter is smaller than required for the second modulation scheme, wherein an image reject mixer providing a second ratio of image rejection is connected to the tuneable bandpass filter, wherein the ratio of image rejection provided by the image reject mixer is smaller than required for the second modulation scheme, wherein the first and second ratios of image rejection are selected so that the sum of the ratios of image rejection achieves or exceeds the required predetermined ratio of image rejection for receiving signals according to the second modulation scheme, and that an intermediate frequency signal is present at an output of the image reject mixer.

2. Tuner according to claim 1, wherein a variable gain amplifier is connected upstream of the tuneable bandpass filter or the image reject mixer.

3. Tuner according to claim 1, wherein the input is connected to an amplifier or the tuneable bandpass filter via a band select filter.

4. Tuner according to claim 1, wherein the output of the image reject mixer is fed to a fixed frequency bandpass filter.

5. Tuner according to claim 4, wherein the fixed frequency bandpass filter is a surface acoustic wave filter.

6. Television apparatus including a tuner according to any one of the preceding claims.

* * * * *